United States Patent [19]

Landrini

[11] Patent Number: 4,763,069
[45] Date of Patent: Aug. 9, 1988

[54] DIODE SAFETY BARRIER

[75] Inventor: Glisente Landrini, Agrate Brianza, Italy

[73] Assignee: Elcon Instruments SRL., Agrate Brianza, Italy

[21] Appl. No.: 940,116

[22] Filed: Dec. 10, 1986

[51] Int. Cl.[4] ................................................ G01R 27/02
[52] U.S. Cl. ............................. 324/158 D; 324/73 R; 324/158 R
[58] Field of Search ............ 324/158 D, 158 R, 73 R, 324/73 PC; 340/870.19; 455/602

[56] References Cited

U.S. PATENT DOCUMENTS

| 3,956,698 | 5/1976 | Malmberg et al. | 324/158 D |
| 4,230,986 | 10/1980 | Deaver et al. | 324/73 PC |
| 4,301,403 | 11/1981 | Hawkes et al. | 324/73 PC |
| 4,691,384 | 9/1987 | Jobe | 455/602 |

OTHER PUBLICATIONS

"The Memory Leader Offering the Fastest Memory Available; Byte; Nov. 1984; p. 165.

Primary Examiner—Reinhard J. Eisenzopf
Assistant Examiner—Vinh P. Nguyen
Attorney, Agent, or Firm—Banner, Birch, McKie & Beckett

[57] ABSTRACT

There is disclosed a barrier in which two or more Zener diodes are mounted in parallel in an encapsulated module between the leads from an input/output terminal located in a safe area to or input/output terminal in a hazardous area such as an environment having an explosive mixture of gases or dust, and a current-limiting resistor in series with an interconnected end of said diodes, wherein the circuit elements in the encapsulated module are connected individually at each end to one of a series of input/output pins extending from said module whereby they can be individually tested and the pins are adapted to be interconnected selectively externally of said module to complete the barrier circuit.

7 Claims, 1 Drawing Sheet

DIODE SAFETY BARRIER

BACKGROUND OF THE INVENTION

This invention relates to a diode safety barrier for limiting the transfer of electrical energy in one direction between a safe area and a hazardous area to a level that is too low to initiate an explosive reaction. The barriers are used for example between a control room and a processing room where there may be an explosive atmosphere of gases or dust and where there are temperature sensors, photocells or other measuring devices for monitoring conditions in the processing room and supplying process information to instruments or control apparatus in the control room.

A typical shunt diode safety barrier is essentially an energy diverting circuit comprising two forward-connected or Zener diodes or diode chains in parallel between a pair of input and output terminals, and having a current-limiting "infallible" type resistor as well as a fuse for additional protection in series with one of the terminals and the diodes whereby the diodes serve to limit the voltage transmitted and the resistor limits the current. The device is encapsulated for protection and to provide electrical insulation, and is provided with input/output pins for connection in an external circuit. The circuit may be polarized to pass signals of one polarity or non-polarized.

One of the requirements for diode safety barriers is that not only the circuits but the individual components thereof must be one hundred percent individually tested after the elements have been encapsulated in a module in order to guard against faults introduced during the encapsulation. This can be done by encapsulating the circuit completely except for leads to be used to test and confirm the operation of the elements of the circuits, after which the leads are themselves encapsulated in a further operation. This method requires two steps of encapsulation which is inherently expensive and time consuming and, once the unit is fully encapsulated, the components cannot be retested or inspected.

Another approach is as illustrated in the patent of Hawkes et al., U.S. Pat. No. 4,301,403 wherein there is disclosed a diode barrier circuit in which a low value resistor is connected between the diodes so that, by passing a sufficiently large current through one of the diodes, it can be turned off and thus allow measurements to be made on the other—the current being pulsed to avoid blowing the fuse in the barrier circuit. Testing each of the circuit components in this manner is not only difficult and relatively expensive but is also somewhat inaccurate and is limited to use with circuits having only a limited number of diodes, such as two diode chains or a star connected barrier.

The proper functioning of the barrier design is paramount since essential monitoring and measurement controls are needed in the hazardous environment. Thus, accurate testing of the components is essential. The need to quickly and accurately retest the individual components is also required for example to assist in determining the cause in the event of a failure, that is, to prove that the barrier was or was not operating properly.

SUMMARY OF THE INVENTION

In accordance with this invention there is provided a diode safety barrier in which the circuit module has input/output pins extending from the encapsulated module and connected therein to each of the circuit elements to provide for testing each of the elements individually. The module is mounted on a mother board where certain ones of the input/output pins are interconnected to complete the circuit and to provide for connecting the barrier to external circuits. The mother board may also include a fuse of a lower value than the fuse in the circuit module so that it will be blown first. Since the fuse in the mother board is replaceable while that of the circuit module is not, the circuit module will survive such an event and thus preserve the integrity of the circuit module.

In addition to the fact that the input/output pins provide for convenient testing of the components of the barrier circuit after they have been encapsulated in the circuit module, they can also be connected to the mother board such as by soldering and thus, when unsoldered, can be conveniently re-tested.

DETAILED DESCRIPTION

Figure 1:
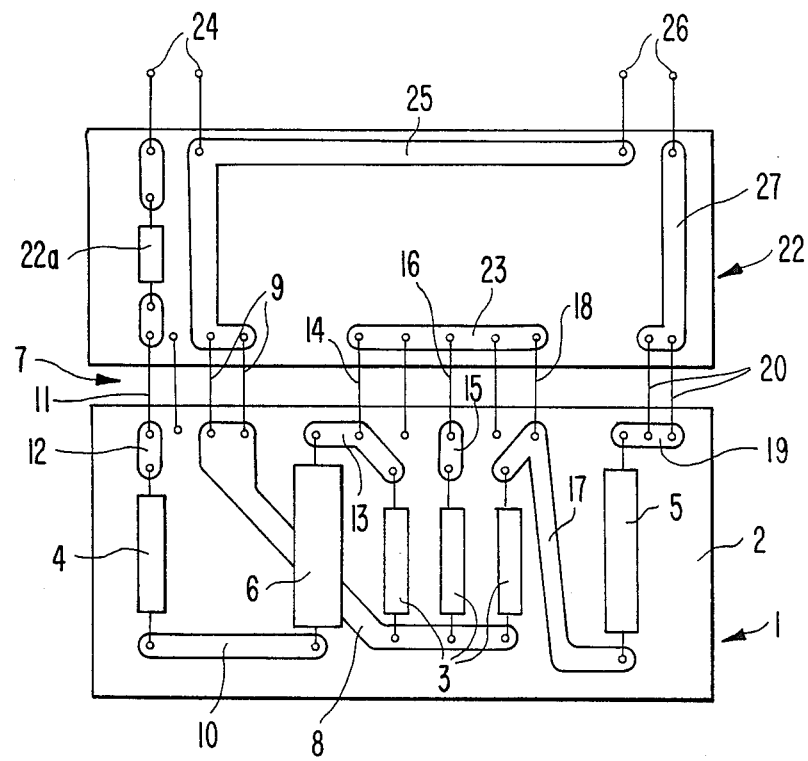
FIG. 1 is schematic view of a diode barrier in accordance with this invention.

With reference to the drawings, there is illustrated a diode barrier circuit 1 printed on a substrate 2 of insulating material and comprising, for example, three Zener diodes 3, a low value current-limiting resistor 4, a high value current-limiting resistor 5 and a fuse 6. Extending from the substrate 1 are three groups of input/output pins 7, the first group consisting of four pins while the other two consist of five and two pins respectively.

One end of each of the diodes 3 is interconnected by a conductor 8 deposited on the surface of the substrate 1, which is also connected to pins 9 of one of the groups of input/output pins 7. One end of the resistor 4 and of the fuse 6 are interconnected by a conductor 10 deposited on the substrate 2 while the opposite end of the resistor 4 is connected to a pin 11 by a conductor 12 and the opposite end of the fuse 6 is connected by a conductor 13 to the pin 14 as well as to the end of one of the diodes 3 opposite from the end connected to the conductor 8.

Another of the diodes 3 is connected by a conductor 15 to a pin 16, while the third of the diodes 3 is connected by a conductor 17 to a pin 18 and to one of the resitor 5, the other end of which is connected by a conductor 19 to pins 20.

Figure 2:
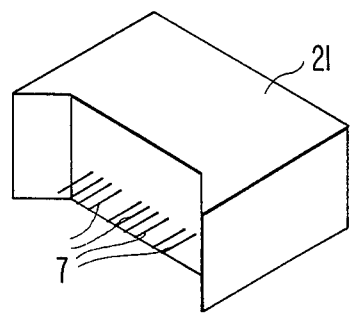
FIG. 2 is a perspective view of a circuit module in accordance with FIG. 1.

The barrier circuit is adapted to be mounted in a casing and encapsulated therein by an epoxy resin to define a circuit module 21 from which the spaced and aligned input/output pins 7 extend as shown in FIG. 2.

The diodes 3 and the resistors 4 and 5 are adapted to be tested individually within the encapsulation in the module 21 by the pins 7—that is, the first diode 3 can be tested by the pins 9 and 14, the second diode 3 by the pins 9 and 16, the third diode 3 by the pins 9 and 18, the resistor 5 by the pins 18 and 20, and the resistor 4 by the pins 11 and 14.

Figure 4:
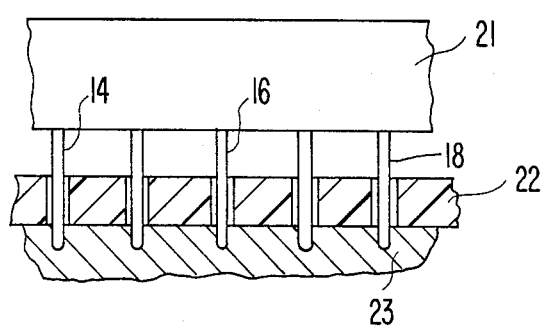
FIG. 4 is a fragmentary sectional view showing the connectio of the circuit module to the mother board.

The module 21 is adapted to be mounted on a specially designed mother board 22, which also includes printed circuit conductors deposited on a substrate of insulating material and which may be adapted to carry, for example, two or three other modules 21. As shown in FIG. 1, mother board 22 has a novel layout design including module mating receptacles which are positioned to receive pins 7 of the module and, upon insertion, to automatically create the desired circuit configuration for the barrier. The input/output pins 7 of the module are adapted to be inserted through receptacles in the mother board and to be soldered therein with all of the five pins in the second group of pins 7, including the pins 14, 16 and 18, being soldered together as illustrated in FIG. 4 and as shown schematically by the conductor 23 in FIG. 1, thus connecting the diodes 3 in parallel between the input/output pins 9 and 20 and with the one end thereof in series with the resistor 5. While soldering is a preferred method of connecting the module to the mother board, it is contemplated that other methods or means can be used which provides a removable connection.

A second fuse 22a is provided on the mother board and is connected to the input/output pin 11 as by soldering and to the energy side of a pair of accessible output terminals 24. The ground side of the terminals 24 is connected by a conductor 25 to the ground pins 9 which are soldered together and to the ground side of a second pair of accessible input terminals 26. The energy side of the terminals 26 is connected by a conductor 27 to the pins 20 which are also soldered together.

In the normal course, the mother board is adapted to be mounted in a removable enclosure that is located in a safe area while the input terminals 26 are adapted to be connected, for example, to a thermocouple or a photocell in a hazardous area, while the output terminals 24 are adapted to be connected to an instrument or control device in a safe area.

Figure 3:
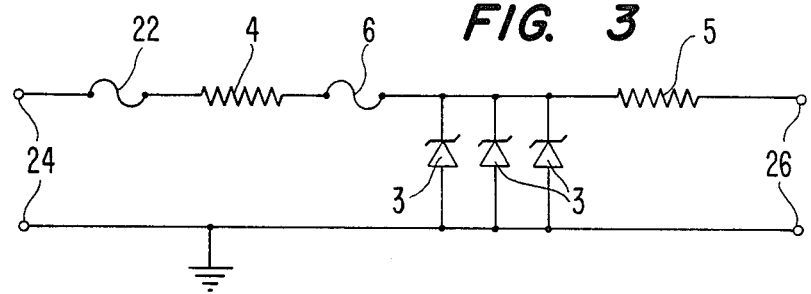
FIG. 3 is a circuit diagram of the circuit illustrated in FIG. 1.

The circuit is illustrated in FIG. 3. The energy terminal of the terminals 24 is connected by way of the fuse 22, the resistor 4, the fuse 6 and the resistor 5 to the energy terminal of the terminals 26. At the same time, the diodes 3 are connected in parallel to the energy lead between the fuse 6 and the resistor 5 whereby in the event of a voltage in excess of the established limit, the diodes 3 will short the signal lead to ground. As mentioned above, each of the circuit elements is adapted to be tested individually by means of the pins 7 after the module is encapsulated and before it is mounted on the mother board, and by unsoldering pins 7 from the mother board, the circuit elements can be subsequently retested.

The novel layout for both the module and the mother board permits a diode safety barrer which complies with the national and international safety standards requiring full testing of all elements after encapsulation. Further, upon inserting the module pins into the mother board, the desired circuit configuration for the barrier is automatically produced. In addition, the novel design provides an easy and inexpensive retesting capability to determine for example that the barrier was operating properly in the event of a failure.

The circuit shown in FIG. 3 can be modified in numerous ways and still achieve the objectives of the design in accordance with this invention. For example, while the diodes as herein disclosed are tested individually, they may also be tested in series with a resistor that will function to limit current in the testing circuit. Current limiting diodes may also be used in place of the current limiting resistors. Various Zener barrier circuits can also be designated for use in grounded or ungrounded intrinsically safe apparatus. In the case of a grounded intrinsically safe apparatus, a single channel barrier as, for example, shown in FIG. 3 can be used or a double channel barrier can be used having components of one channel being a mirror image of the components of the other channel. In the case of an ungrounded intrinsically safe apparatus, a double channel barrier with return can be used whereby the current limiting resistor or diode of one channel has a resistance that is different than the resistance of the current limiting element in the other channel.

Modification of the specific arrangement herein disclosed will be obvious to those skilled in the art.

I claim:

1. In a diode safety barrier, a module comprising a circuit having a plurality of diodes electrically interconnected at one and a current-limiting device connected in series with one of said diodes at the end opposite from said interconnected end thereof, a casing in which said circuit is mounted and encapsulated and input/output pins extending from said module and connected individually within the encapsulation to the interconnected ends of said diodes and to the ends of each of said diodes opposite from said interconnected ends whereby each of the diodes can be individually tested in the encapsulation through the respective input/output pins, and means externally of said module and means for removably connecting the same to said module through said input/output pins for connecting the interconnected end of said diodes to ground and for connecting together the ends of said diodes opposite from said interconnected ends, and for connecting the end of one of said diodes opposite from said interconnected end in the encapsulation and the end of said current-limiting device opposite from the end connected to said diode to signal terminals.

2. In a diode safety barrier in accordance with claim 1 in which said diodes are Zener diodes.

3. In a diode safety barrier in accordance with claim 1 in which said means for connecting the ends of one of said diodes opposite from said interconnected end to a signal terminal includes a resistor and a fuse in series within the encapsulation.

4. In a diode safety barrier in accordance with claim 3 in which there is a fuse externally of said module and in series with the fuse in said module.

5. In a diode safety barrier in accordance with claim 1 in which said means external of said module comprises a mother board having apertures for receiving said input/output pins, and said means for removably connecting said means externally of said module to said module comprises means electrically connected to said pins for securing said input/output pins in said apertures and surface conductors deposited on said mother board and electrically connected to said means for securing said input/output pins in said apertures.

6. In a diode safety barrier in accordance with claim 5 in which the means for securing said input/output pins in said apertures provide for disconnecting the same whereby the module is removable from said mother board and the diodes and resistors therein re-tested.

7. In a diode safety barrier in accordance with claim 6 in which the means for securing said input/output pins in said aperture comprises soldering.

* * * * *